(12) United States Patent
Nakatani et al.

(10) Patent No.: US 9,236,338 B2
(45) Date of Patent: Jan. 12, 2016

(54) BUILT-UP SUBSTRATE, METHOD FOR MANUFACTURING SAME, AND SEMICONDUCTOR INTEGRATED CIRCUIT PACKAGE

(71) Applicant: Panasonic Corporation, Osaka (JP)

(72) Inventors: Seiichi Nakatani, Osaka (JP); Koji Kawakita, Nara (JP); Susumu Sawada, Osaka (JP); Yoshihisa Yamashita, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 43 days.

(21) Appl. No.: 14/122,323

(22) PCT Filed: Oct. 29, 2012

(86) PCT No.: PCT/JP2012/006919
§ 371 (c)(1),
(2) Date: Nov. 26, 2013

(87) PCT Pub. No.: WO2013/145043
PCT Pub. Date: Oct. 3, 2013

(65) Prior Publication Data
US 2014/0124777 A1    May 8, 2014

(30) Foreign Application Priority Data

Mar. 27, 2012    (JP) .................... 2012-071996

(51) Int. Cl.
*H01L 21/48* (2006.01)
*H05K 1/03* (2006.01)
*H01L 23/498* (2006.01)
*H05K 3/46* (2006.01)
*H01L 23/15* (2006.01)
*H01L 23/373* (2006.01)

(52) U.S. Cl.
CPC ...... *H01L 23/49822* (2013.01); *H01L 21/4857* (2013.01); *H01L 23/15* (2013.01); *H01L23/49827* (2013.01); *H05K 1/0306* (2013.01); *H05K 1/0313* (2013.01); *H05K 3/4673* (2013.01); *H05K 3/4682* (2013.01); *H01L 23/3731* (2013.01); *H01L 2224/16225* (2013.01); *H05K 2201/017* (2013.01); *H05K 2201/0175* (2013.01); *H05K 2203/0126* (2013.01); *H05K 2203/0514* (2013.01); *H05K 2203/1366* (2013.01)

(58) Field of Classification Search
CPC .............. H01L 23/49822; H01L 23/49827; H01L 2224/16225; H01L 21/4857; H01L 23/15; H01L 23/3731; H05K 3/4682; H05K 2201/017; H05K 2203/0514; H05K 3/4673; H05K 2203/0126; H05K 1/306
See application file for complete search history.

(56) References Cited

U.S. PATENT DOCUMENTS

| 4,921,777 | A | * | 5/1990 | Fraenkel | ............. H05K 3/4644 |
| | | | | | 205/125 |
| 4,923,997 | A | * | 5/1990 | Klemarczyk | ........ C08G 77/388 |
| | | | | | 548/406 |
| 5,451,721 | A | | 9/1995 | Tsukada et al. | |
| 2005/0263867 | A1 | * | 12/2005 | Kambe et al. | ................. 257/678 |
| 2007/0001312 | A1 | | 1/2007 | Murayama et al. | |
| 2010/0301329 | A1 | * | 12/2010 | Asano et al. | .................... 257/43 |
| 2011/0090656 | A1 | * | 4/2011 | Hamatani et al. | ............. 361/761 |

FOREIGN PATENT DOCUMENTS

| JP | 02-255464 | 10/1990 |
| JP | 03-233997 | 10/1991 |
| JP | 04-148590 | 5/1992 |
| JP | 08-279678 | 10/1996 |
| JP | 8-307061 | 11/1996 |
| JP | H08307061 | * 11/1996 ............... C04B 1/88 |
| JP | 2000-307141 | 11/2000 |
| JP | 2000-313612 | 11/2000 |
| JP | 2005-191243 | 7/2005 |
| JP | 2007-012854 | 1/2007 |

| JP | 2008-270768 | 11/2008 |
| JP | 2009-64973 | 3/2009 |
| JP | 2011-109077 | 6/2011 |

OTHER PUBLICATIONS

Sze, Semiconductor Devices. Physics and Technology. 2nd Edition, pp. 18-19.*
International Search Report issued Jan. 29, 2013 in corresponding International Application No. PCT/JP2012/006919.
International Preliminary Report on Patentability and Written Opinion of the International Searching Authority issued Oct. 9, 2014 in International(PCT) Application No. PCT/JP2012/006919.

* cited by examiner

*Primary Examiner* — Galina Yushina
(74) *Attorney, Agent, or Firm* — Wenderoth, Lind & Ponack, L.L.P.

(57) ABSTRACT

A method for manufacturing a build-up substrate, the build-up substrate comprising an insulating layer and a wiring pattern layer stacked over a circuit substrate, said method comprising the steps of: (i) applying a photoactive metal oxide precursor material to one or both sides of the circuit substrate with a wiring pattern, and drying the applied photoactive metal oxide precursor material to form an insulating film; (ii) forming an opening for a via hole in the insulating film by exposure and development of the insulating film; (iii) applying a heat treatment to the insulating film to convert the insulating film into a metal oxide film, thereby forming a build-up insulating layer of the metal oxide film; and (iv) plating the build-up insulating layer to form via holes in the openings, forming a metal layer on the build-up insulating layer, and etching the metal layer to form a build-up wiring pattern; and (v) repeating the steps from (i) to (iv) at least one time.

20 Claims, 11 Drawing Sheets

(a)

(b)

(c)

(d)

(e)

(f)

Spray method

Slit coater method (a)

(b)

(c)

(d) Exposure (e)

Process using a photosensitive resin(conventional art)

① Providing Core Substrate

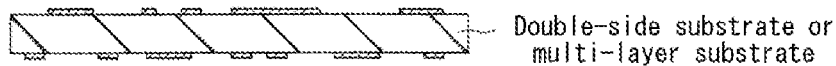
Double-side substrate or multi-layer substrate

② Coating photoactive resin, Exposure

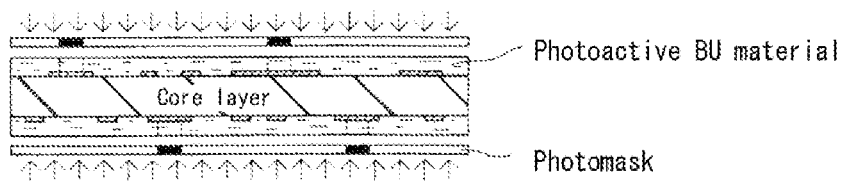
Photoactive BU material
Photomask

③ Development, Roughening

④ Coppering plating, Patterning

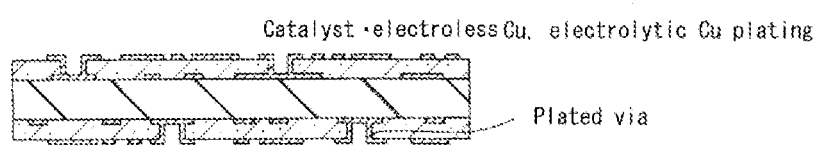
Catalyst ·electroless Cu, electrolytic Cu plating
Plated via

⑤ Repeat of build-up, Penetrated through hole

Fig. 14

Conformal process (conventional art)

① Providing Core Substrate

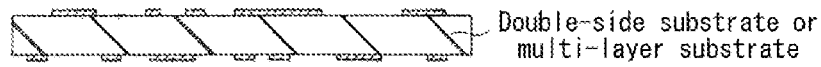
Double-side substrate or multi-layer substrate

② Resin Coated Copper Foil (RCC) build up, etching

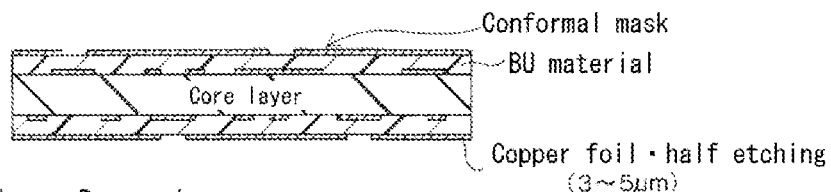
Conformal mask
BU material
Core layer
Copper foil・half etching (3～5μm)

③ Laser Processing
Laser Processing (CO₂ UV-YAG)

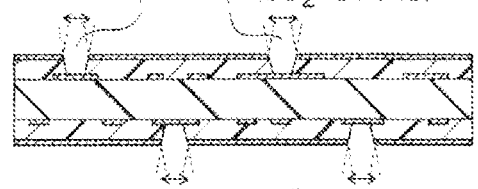

④ Coppering plating, Patterning
Catalyst・electroless Cu, electrolytic Cu plating

Plated via

⑤ Repeat of build-up, Penetrated through hole

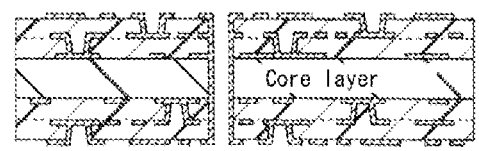
Core layer

BUILT-UP SUBSTRATE, METHOD FOR MANUFACTURING SAME, AND SEMICONDUCTOR INTEGRATED CIRCUIT PACKAGE

TECHNICAL FIELD

The present invention relates to build-up substrates, manufacturing methods thereof, and semiconductor integrated circuit packages. More particularly, the present invention relates to a build-up substrate including a build-up insulating layer substantially formed of inorganic material, and a method for manufacturing the build-up substrate. Further, the present invention also relates to a semiconductor integrated circuit package that can be obtained from the build-up substrate.

BACKGROUND OF THE INVENTION

The development of electronic devices contributes to the speeding up of the operation of semiconductor integrated circuits (LSI) used in a CPU or GPU of a computer, a digital television, a smartphone, and the like. Particularly, image processing LSI or the like is being speeded up and highly integrated, and thus is desired to further reduce its size or respond to the increase in number of I/O terminals.

With the miniaturization and increase in number of the I/O terminals at the same time, the miniaturization or decrease of a terminal pitch is further progressed, which makes it difficult to mount a semiconductor integrated circuit on a package wiring substrate.

A ceramic substrate having excellent heat conductivity is hitherto used as the wiring substrate for the LSI package. The ceramic substrate has not only the excellent heat resistance and humidity resistance, but also small heat expansion coefficient and low warpage, and therefore is appropriate for metal bonding, such as soldering. However, the ceramic substrate is difficult to fire in a large size. It tends to cause cracks, and thus, the ceramic substrate is not appropriate for thinning.

A build-up wiring substrate is generally formed of a plurality of build-up layers including an interlayer insulating layer, a via hole, and a copper foil wiring layer stacked on both sides of a core substrate made of an organic material, such as an epoxy resin. Such build-up wiring substrate is used as a wiring substrate for the LSI package. For example, Patent Document 1 discloses a build-up substrate which is produced by forming a via hole (photovia process) using a photosensitive build-up resin insulating material, and then by forming wirings by copper plating (see with FIG. 13). Patent Document 2 discloses a build-up substrate which is produced by forming a via hole in a build-up insulating layer by laser process (in a photovia process), and then forming wirings by copper plating in the same way as the above document. Further, Patent Document 3 discloses a method (conformal process) which involves previously forming an opening in a copper foil by etching, and forming a fine via hole in a layer of interest by performing laser processing on the opening (see with FIG. 14).

In the latest CPU, the microfabrication is progressing up to 22 nm, while the number of I/O terminals is increasing and circuits are becoming larger. Applications of servers increasingly require the larger-sized semiconductor integrated circuit chip. The use of such a large-sized chip causes warpage of even the normal build-up substrate during a manufacturing process or due to a heat history during mounting of a LSI chip, which might peel off a soldered portion of a joint. Additionally, the miniaturization of a small-sized via hole process or a fine wiring pitch reduces the insulating reliability, which might decrease the withstand voltage or cause insulating failure. Recently, in order to meet the requirement for the further thinning, devices using a substrate consisting of only a build-up layer in place of the core substrate are being increasingly employed. For this reason, an insulating material with higher reliability that is applicable for the thinned devices is required.

CONVENTIONAL ART PATENT DOCUMENTS

Patent Document 1: JP 4-148590 A
Patent Document 2: JP 3-233997 A
Patent Document 3: JP 8-279678 A

DISCLOSURE OF THE INVENTION

Problems to be Solved by the Invention

In bare-chip mounting of a high-integrated semiconductor on a large-sized chip, a build-up substrate having a fine wiring pitch and a small-sized via connection is essential. However, the above-mentioned three build-up substrates make it very difficult to achieve the high reliability.

Specifically, the first photovia process uses the photosensitive resin material and collectively exposes the resin material to light to form via holes. The first photovia process has advantages of the high relative positional accuracy of the holes and the short tact time. However, the above photovia process involves using the photosensitivity of the photosensitive resin material, and thus might make it difficult to ensure the insulating property, or might have a low bonding strength with a copper electrode formed by plating. The second laser via process involves "forming a hole by laser processing", and thus has the advantage that is less likely to be affected by dust in formation of the hole, but is not suitable for decreasing the size or diameter of the hole due to the accuracy focusing of the laser. Further, the second laser via process has the defects of the long tact time because of the processing of the holes in order, and the large equipment costs. The via process cannot have satisfactory positional accuracy with respect to the photovia process. The third conformal process involves laminating and bonding a copper foil coated with a build-up resin over a substrate, removing a part for a via hole from the foil by etching to make an opening in the foil, and forming a via hole in a layer of interest by irradiation of a laser beam having a spot diameter smaller than that of the opening. This process uses the difference in absorption rate of laser from copper, and so is very suitable for decreasing the size or diameter of the via hole. Further, the third process includes the step of previously bonding the copper foil, and thus can provide a wiring with excellent adhesion. However, the conformal process involves processing the holes in order, like the laser via process, and thus is disadvantageous from the viewpoint of the tact time and equipment costs. Also, the conformal process has the defect of poor positional accuracy.

As mentioned above, the first conventional method using the photosensitive resin material may have the problem of the insulating reliability of the insulating material due to the fine wiring and thinning. The second and third conventional methods for performing the via hole processing by use of the laser machining method have the problems of the high cost of a laser machining equipment and of poor processing positional accuracy due to a lens aberration or the like. Further, the second and third conventional methods are disadvantageous in reducing the size, and may have the problems of the processing tact time due to the processing of the via holes not collectively but in order. As mentioned above, the second and third methods can have lots of problems associated with the laser machining equipment.

It is difficult to eliminate the influence of the warpage of the build-up substrate with the latest semiconductor bare chip mounted thereon. This is because the insulating material of the build-up substrate is made of an organic material and thus cannot have a high elastic modulus. The ceramic substrate having a high elastic modulus is generally effectively used because the ceramic substrate is superior to the build-up substrate in terms of the high elastic modulus. However, the ceramic has the problems that cannot produce a large-sized substrate, resulting in high costs. For example, the ceramic substrate has a size of about 100 mm×100 mm, while a printed board typified by the build-up substrate has a size of about 340 mm×510 mm. The ceramic substrate has poor productivity as compared to the normal build-up substrate. From this aspect, the ceramic substrate can be proposed to have its size increased, but only the increase in size of the ceramic substrate causes a break or crack in the substrate as mentioned above. When such a break or crack is intended to be prevented, the delivery of the ceramic substrate on the process becomes difficult, or the ceramic substrate has to be thickened more than necessary. A setter for burning to be used in manufacturing a large-sized ceramic substrate is very difficult to manufacture. Even if the setter for burning can be manufactured, the setter will be very expensive, or is strictly required to have the adequate flatness which can directly affect the warpage of the ceramic substrate.

The present invention has been made in view of the foregoing circumstances. Accordingly, it is a main object of the present invention to provide a large-sized build-up substrate that can contribute to improvement of the productivity, and specifically, with high reliability that is suitable for miniturization of wirings and thinning of an insulating layer.

Means for Solving the Problems

In order to achieve the above object, the present invention provides a method for manufacturing a build-up substrate, the build-up substrate comprising an insulating layer and a wiring pattern layer stacked over a circuit substrate, the method comprising the steps of:

(i) applying a photoactive metal oxide precursor material to one or both sides of the circuit substrate with a wiring pattern, and drying the applied photoactive metal oxide precursor material to form an insulating film;

(ii) forming an opening for a via hole in the insulating film by exposure and development of the insulating film;

(iii) applying a heat treatment to the "insulating film with the opening for the via hole formed therein" to convert the insulating film into an inorganic metal oxide film, thereby forming a build-up insulating layer of the inorganic metal oxide film; and (iv) plating the entire build-up insulating layer to form via holes in the openings and a metal layer over the build-up insulating layer, and etching the metal layer to form a build-up wiring pattern; and (v) repeating the processes of the steps (i) to (iv) at least one time.

One of the features of the manufacturing method of the present invention is that the "photosensitive metal oxide precursor material" is used as material for the build-up insulating layer. Specifically, the lithography, including exposure and development, is performed on the insulating film formed by applying and drying the "photosensitive metal oxide precursor material" to form via holes, and then the insulating film is subjected to the heat treatment to convert into the metal oxide insulating film, which produces a thin build-up insulating layer with excellent reliability of insulation.

The term "build-up" as used herein is used taking into consideration the fact that the substrate of interest of the present invention has the laminated structure. For example, the term "build-up" as used therein means the form of the laminated structure with alternating insulating layers and wiring patterns stacked over the substrate, such as the circuit substrate (also called a "core layer") having a wiring pattern (note that the term "build-up" as used in the present invention is not necessarily limited to an embodiment provided with the core substrate, and can also include an embodiment in which the core substrate is finally removed).

The term "photoactive" as used herein means the physical or chemical property of a light-irradiated part which is changeable by the irradiation of the light.

The present invention also provides a build-up substrate obtained by the above manufacturing method. The build-up substrate of the present invention includes a build-up insulating layer and a build-up wiring pattern stacked over one or both sides of a circuit substrate with a wiring pattern, in which the build-up insulating layer includes an inorganic metal oxide film formed of the photoactive metal oxide precursor material.

One of the features of the build-up substrate according to the present invention is that the build-up insulating layer is an "inorganic film of metal oxide formed by using the photoactive metal oxide precursor material".

The present invention also provides a semiconductor integrated circuit package using the above-mentioned build-up substrate. In the semiconductor integrated circuit package of the present invention, a semiconductor bare chip is flip-chip mounted on the build-up wiring pattern located over a build-up insulating layer via a bump.

Effects of the Invention

The manufacturing method of a build-up substrate according to the present invention uses the "photosensitive metal oxide precursor material", which can result in the thin build-up insulating film with excellent reliability of insulation. The "photosensitive metal oxide precursor material" may be the material in the form of paste or liquid, and thus may be applied by the spray method or slit coaster method, which can easily achieve the formation of the film in a uniform thickness over the substrate having a large size. The coated film (more specifically, "insulating film obtained by drying after application") is made of the "photosensitive metal oxide precursor material" and thus can be exposed and developed at one time. As a result, the via holes can be collectively processed. Thus, the positional accuracy of the via holes can be improved. That is, the via holes having a small diameter can be easily formed even in the large-sized substrate at low cost.

The manufacturing method of the present invention in the present application has a high flexibility in selection of the circuit substrate for the core because the heating temperature for obtaining the metal oxide film is relatively low. For example, the build-up substrate can have the desired elastic modulus or bending property depending on the type of the core substrate. By way of example, when the insulating material of the circuit substrate (insulating base) as the core is made of organic material, the build-up substrate can be obtained which can exhibit some bending property, and which has the high reliability of insulation and high flexibility. In contrast, when the insulating material of the circuit substrate (insulating base) as the core is made of inorganic material, all the build-up insulating layers and the build-up wiring patterns can be substantially formed of inorganic material. Thus, the build-up substrate can improve the reliability as the substrate, and can also have the high reliability of mounting because its thermal expansion coefficient is substantially similar to that of a silicon semiconductor.

Further, the present invention can provide the dense build-up insulating layer that can have the high elastic modulus even in a very small thickness of 1 μm or more and 20 μm or less because the insulating layer is formed of the "metal oxide inorganic film", and hence achieves the thin semiconductor package suitable for use in mobile devices.

The build-up substrate of the present invention has the high elasticity and adequate thermal expansion even when the substrate is small in thickness and large in size, which can suppress the break or cracking of the build-up substrate. Therefore, the present invention can suitably manufacture the build-up substrate using a manufacturing infrastructure of a printed board.

BRIEF DESCRIPTION OF THE DRAWINGS

FIG. 13 is a cross-sectional view schematically showing the steps of a manufacturing process using a photosensitive resin (in the conventional art); and FIG. 14 is a cross-sectional view schematically showing the steps of a conformal process (in the conventional art).

MODES FOR CARRYING OUT THE INVENTION

Figure 1:
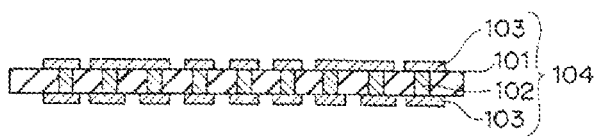
FIGS. 1(a) to 1(f) are cross-sectional views schematically showing the steps of a manufacturing process according to a first embodiment of the present invention.
Figure 1:
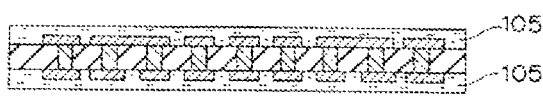
Figure 1:
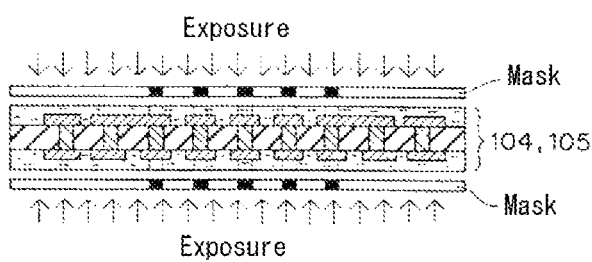
Figure 1:
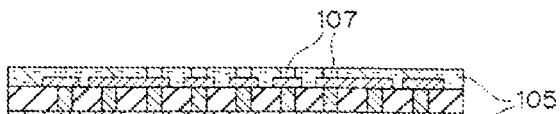
Figure 1:
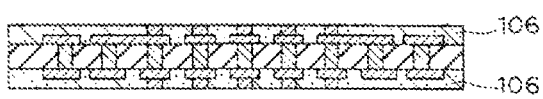
Figure 1:
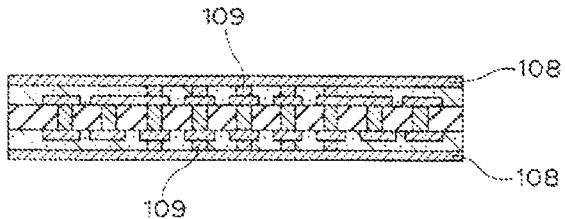

Embodiments of the present invention will be described in detail with reference to the accompanying drawings. For easy understanding, the same reference numbers will be used throughout the drawings to refer to elements having substantially the same function. The size relationship (in length, width, thickness, or the like) of the elements throughout the drawings does not reflect the actual size relationship therebetween. The term "vertical direction" as indirectly mentioned herein corresponds to the up-down direction in the drawing for convenience.

Manufacturing Method of Build-Up Substrate of Invention

Manufacturing Process of First Embodiment

A manufacturing method of a build-up substrate according to a manufacturing process of a first embodiment of the present invention will be described below with reference to FIGS. 1 and 2.

In performing the manufacturing method of the present invention, first, step (i) is performed. That is, a photosensitive metal oxide precursor material is applied to one or both sides of a circuit substrate including a wiring pattern, and then the applied material is dried to form an insulating film. Specifically, as shown in FIG. 1(a), a circuit substrate 104 is provided which has wiring patterns 103 on both or one side thereof. For example, the circuit substrate 104 with the wiring patterns 103 on its both sides can be obtained in the following way. That is, a metal layer made of a copper foil is laminated on each side of a base 101 formed by immersing a glass woven fabric in an epoxy resin. Then, the base with the metal layers are heated and pressed to be integrated together, and further etched by photolithography to form the wiring patterns 103. After lamination of the copper foils, hole drilling and plating may be performed to form through holes 102 for interlayer connection (see FIG. 1(a)).

Then, "photoactive metal oxide precursor material" is applied to each side of the circuit substrate 104, and dried to form an insulating film 105 (see FIG. 1(b)). The "photoactive metal oxide precursor material" contains, for example, an organic solvent, and can take the form of paste or liquid. The "photoactive metal oxide precursor material" in the form of paste has a viscosity of, for example, about 1 mPa·s to 50 Pa·s (specifically, about 10 mPa·s to 50 Pa·s) at room temperature (25° C.) at a shear rate of 1,000 (1/s). The material having such a range of viscosity can be effectively prevented from spreading over an applied area. The invention employs the "photoactive metal oxide precursor material" in the form of paste or liquid, and thus can use the spray method (see FIG. 3) or slit coater method (see FIG. 4) to apply the material to the base.

Figure 3:
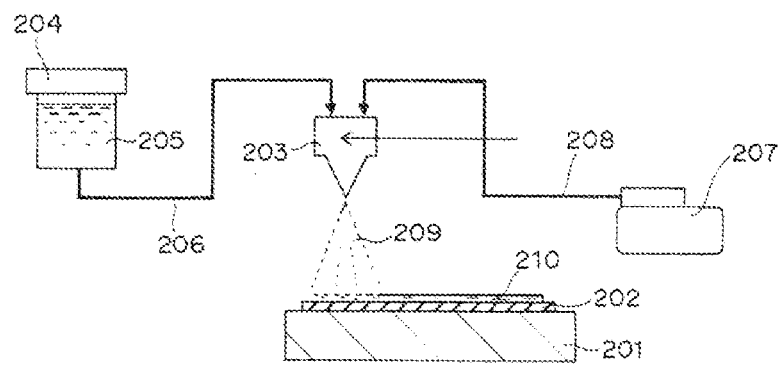
FIG. 3 is a cross-sectional view schematically showing an embodiment form of a spray method.

In the spray method, as shown in FIG. 3, a "photoactive metal oxide precursor material 205" in a reservoir tank 204 is supplied to a spray nozzle 203 through a supply pipe 206, while compressed air is supplied as a carrier gas from a press pump 207 to the spray nozzle 203 via a pipe 208. Then, a constant amount of the "photoactive metal oxide precursor material" is sprayed (as sprayed form 209) over a circuit substrate 202 disposed on a stage 201, together with the carrier gas from the spray nozzle 203, which results in formation of a coated film 210 made of the "photoactive metal oxide precursor material". The thickness of the coated film 210 formed on the circuit substrate 202 is, for example, in a range of preferably 4 to 50 μm, more preferably 6 to 30 μm, and most preferably 8 to 20 (for example, about 10 μm). The spray method can easily form the coated film 210 at high speed.

Figure 4:
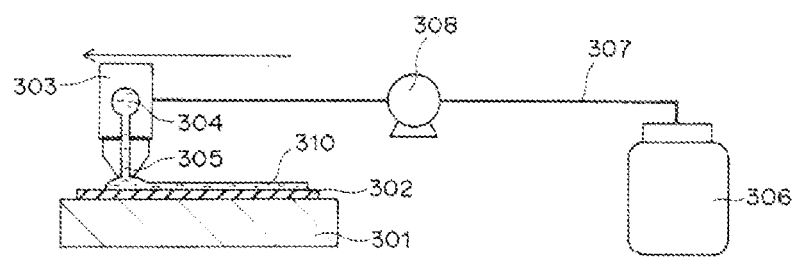
FIG. 4 is an cross-sectional view schematically showing an embodiment of a slit coater method.

In the slit coater method, as shown in FIG. 4, the "photoactive metal oxide precursor material" is supplied by a pump 308 from a reservoir tank 306 to a slit coater nozzle 303 through a pipe 307. Then, the "photoactive metal oxide precursor material" supplied to the slit coater nozzle 303 is temporarily stored in a manifold 304, and then directly applied from a slit 305 to a circuit substrate 302 on a stage 301. The distance between the slit coater nozzle 303 and the circuit substrate 301 can be arbitrarily set. Thus, the thickness of the coated film can be suitably controlled by "adjustment of the gap distance from the circuit substrate 301" and "adjustment of a pump pressure for supplying the photoactive metal oxide precursor material". The slit coater method can form the relatively thick coated film 310 in a large size as compared to in the spray method. Further, the slit coater method can coat the material in a constant thickness. For example, the slit coater method can form the coated film 310 having a thickness of about 30 to 50 μm.

An oxide, specifically, oxide particles (powder of an oxide) may be added to the "photoactive oxide precursor material". This is because the insulating property can be improved and thermal properties (thermal expansion and thermal conductivity) can be controlled in the finally-formed "oxide film". The oxide particle may be a particle containing material selected from the group consisting of, for example, $Al_2O_3$, $SiO_2$, MgO and $TiO_2$ (and thus the oxide particle may be, for example, $Al_2O_3$ particle, $SiO_2$ particle, MgO particle or $TiO_2$ particle). The particle size of the oxide particle is, for example, in a range of about 0.1 μm to about 0.5 μm.

The coated "photoactive metal oxide precursor material" (coated film) is dried out to reduce the amount of organic solvent contained in the film, which results in formation of an insulating film (a precursor film of the metal oxide). That is, the drying process allows components of the organic solvent to vaporize from the metal oxide precursor material. The invention is not necessarily limited to the drying of the "photoactive metal oxide precursor material" by applying heat. As long as the organic solvent is vaporized, other means may be used. For example, the coated "photoactive metal oxide precursor material" may be put under reduced pressure or under vacuum.

In drying the coated material by applying heat, for example, the coated "photoactive metal oxide precursor material" is preferably exposed to the temperature of about 50 to 200° C. (preferably, 60 to 150° C.) under atmospheric pressure. Under reduced pressure or vacuum, the degree of decompression or vacuum can be maintained under a saturated steam pressure of the organic solvent to promote evaporation of the organic solvent. The coated material is preferably exposed, for example, under reduced pressure of about 0.1 to 7 Pa, or under vacuum. The "application of heat" and "under reduced pressure or vacuum" may be combined together to dry the coated material, if necessary.

The thickness of the "dried" insulating film is, for example, in a range of preferably 1 μm to 40 μm, more preferably 2 μm to 15 μm, and most preferably 3 μm to 10 μm (for example, about 4 μm). Taking into consideration a relationship between the coating method and the coated film, in the spray method, by way of example, the coated film may be formed to have a thickness of about 8 to 12 μm, and then dried to have a thickness of about 3 to 5 μm. In contrast, in the slit coater method, the coated film may be formed to have a thickness of about 30 to 50 μm, and then dried to have a thickness of about 20 to 30 μm.

Step (ii) is performed following the step (i). Specifically, the insulating film 105 is subjected to exposure and development, so that openings 107 for a via hole are formed in the insulating film 105 (see FIGS. 1(c) and 1(d)). For example, lithography including the exposure and development may be performed on the insulating film 105 to form the openings 107 for a via hole. (Note that the form of the lithography is not specifically limited. After the exposure and development, rinsing and etching may be performed).

The exposure may include, for example, a method involving providing a photomask with a desired pattern over an insulating film, and a method involving directly exposing without using any mask. In either method, the insulating film is irradiated with appropriate light in a desired pattern. The light for use in irradiation is not specifically limited as long as the light can be used for the normal lithography. For example, the irradiation light can include one corresponding to the so-called "light", such as ultraviolet light (UV), visible light, X rays, infrared light and others corresponding to radiation light, and any ion beam and electron beam if necessary. By way of example, the exposure is performed with the mask using UV light (for example, the amount of light may be in a range of 80 to 120 $mJ/cm^2$ for the UV light having a wavelength of about 360 to 370 nm). The exposure way is not specifically limited, and may be any one of contact exposure, proximity exposure and projection exposure.

After the exposure, the development is performed. The development is not specifically limited as long as the development is one using the normal lithography. Specifically, for the "positive type" in which an exposed region of the insulating film is dissolved into a developing solution, the developing solution suitable for the positive type is preferably used. Conversely, for the "negative type" in which an exposed region of the insulating film is not dissolved in a developing solution, the developing solution suitable for the negative type is preferably used. The development method is not specifically limited, and may use a dipping method, a spray method or a puddling method. Such a developing process forms the openings 107 for the via hole in the insulating film 105. If necessary, after the development, rinsing or etching may be added.

Step (iii) is substantially performed following the step (ii). Specifically, the insulating film 105 is subjected to a heat treatment to convert into an inorganic metal oxide film, thereby producing a build-up insulating layer 106 made of the inorganic metal oxide film (see FIG. 1(e)).

Such a heat treatment causes the reaction or change in form of the insulating film 105 due to the heating of the insulating film 105, which finally forms the inorganic metal oxide film. By way of example, when the "photoactive metal oxide precursor material" contains a photosensitive sol-gel material, a hydrolysis and/or condensation reaction can progress to finally form the inorganic metal oxide film.

The temperature of the heat treatment in step (iii) is a relatively low temperature. Specifically, for example, the temperature of the heat treatment in step (iii) is 500° C. or lower, preferably, 400° C. or lower, and more preferably 300° C. or lower (for example, 250° C. or lower). The lower limit of temperature of such a heat treatment is not specifically limited, for example, 200° C., preferably 150° C., and more preferably 120° C. (for example, 100° C.) by way of example.

The time of the heat treatment for the insulating film 105 is not specifically limited as long as the inorganic film of the metal oxide can be finally obtained (generally, taking into consideration the amount of heat required for the reaction, an appropriate heating time should be determined according to the heating temperature or kind of raw material). The heating means may be, for example, a heating chamber, such as a baking furnace. In this case, the "circuit substrate 104 with the insulating film 105 formed thereover" is put into the heating chamber, so that the insulating film 105 can be subjected to the heat treatment as a whole.

By way of example, in the step (i), the drying temperature is set to about 80 to 120° C. In the step (ii) of exposing with the mask using the UV light (for example, when the amount of light is set to 80 to 120 mJ/cm$^2$ using the UV light having a wavelength of about 360 to 370 nm), the burning at the temperature of about 180 to 220° C. is performed, which can produce the build-up insulating layer 106 made of the metal oxide film.

Step (iv) is substantially performed following the step (iii). Specifically, the build-up insulating layer 106 is plated to form via holes 109 in the openings 107, and a metal layer 108 is formed over the build-up insulating layer 106 (see FIG. 1(f)). The metal layer 108 is etched to form build-up wiring patterns 110 (see FIG. 2(a)).

For example, the build-up insulating layer 106 with the openings 107 for the via hole is subjected to electroless plating and electrolytic plating to thereby form the metal copper layer 108. The electroless plating can use copper, and further the electrolytic plating is performed, so that a thick copper plating layer can be selectively formed not only over the build-up insulating layer 106, but also the openings 107. That is, a flat copper plating can be applied over the build-up layer, while filling in the openings 107.

The opening 107 is filled by the copper plating to form the via hole 109. The opening 107 may improves its adhesion to the copper layer by being subjected to a desmear or roughening treatment. Before the electroless plating, an underlayer made of, for example, Ti may be formed by sputtering. Thus, the adhesiveness between the copper layer and the build-up layer can get better. The thus-formed metal layer 108 is subjected to the photolithography and chemical etching, which may form the build-up wiring patterns 110 from the metal layer 108 as shown in FIG. 2(a).

Throughout the above-mentioned steps, the build-up insulating layer 106 and the build-up wiring patterns 110 can be formed over the circuit substrate 104 (see FIG. 2(a)). Subsequently, when the processes in steps (i) to (iv) are repeatedly performed in step (v), a plurality of the build-up insulating films 106 and build-up wiring patterns 110 can be formed over the circuit substrate 104, which can finally obtain the build-up substrate 100 (see FIG. 2(b)). In other words, a multilayer board (multilayer substrate) with the inorganic insulating films can be obtained as the build-up substrate 100.

Manufacturing Process of Second Embodiment

Next, another manufacturing method of a build-up substrate according to a manufacturing process of a second embodiment of the present invention will be described below with reference to FIGS. 5 and 6 (note that the same features as those in the "manufacturing process of the first embodiment" will be omitted in principle to avoid the redundant description).

Figure 5:
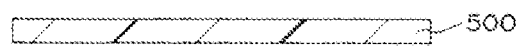
FIGS. 5(a) to 5(g) are cross-sectional views schematically showing the steps of the manufacturing process according to a second embodiment of the present invention.
Figure 5:
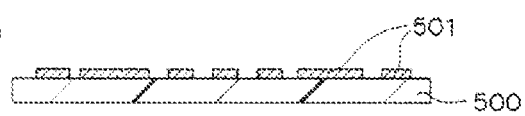
Figure 5:
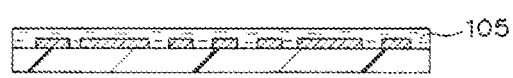
Figure 5:
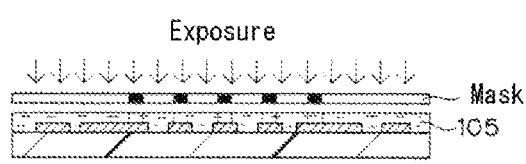
Figure 5:
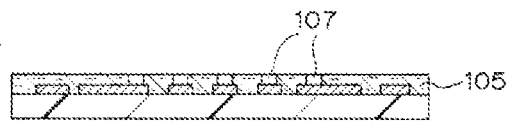
Figure 5:
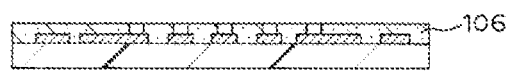
Figure 5:
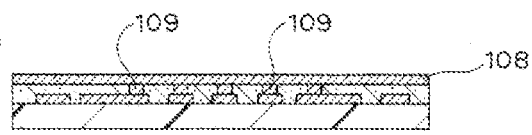
Figure 6:
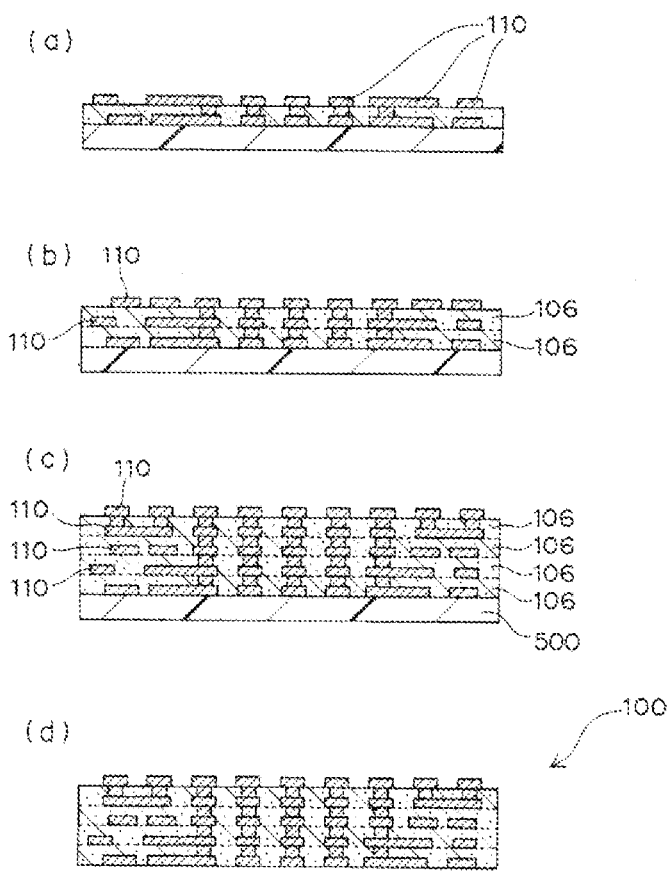
FIGS. 6(a) to 6(d) are cross-sectional views schematically showing other steps of the manufacturing process according to the second embodiment of the present invention.

First, as shown in FIG. 5(a), a release carrier 500 is provided. The release carrier 500 is finally to be removed. The release carrier 500 for use can be an organic film which is easily peeled off, for example, an organic film made of PET or PPS. In another method, the release carrier 500 for use can be a metal foil which is chemically dissolved and removed, for example, a copper foil. The carrier 500 preferably has enough thickness, for example, of 80 to 120 μm, to withstand handling as a carrier during transportation including the following steps. As shown in FIG. 5(b), wiring patterns 501 are formed over the release carrier 500. For example, electroless copper plating may be performed to form a copper plating in a thickness of about 0.3 to 0.7 μm, and by use of the conductivity of the plating, electrolytic copper plating may be performed to form a metal copper layer in a thickness of about 3 to 7 μm. Then, the metal layer obtained by the copper plating is subjected to chemical etching to form wiring patterns 501. Subsequently, the "photoactive metal oxide precursor material" is applied and dried to thereby form a metal oxide precursor film made of the insulating film 105 (see FIG. 5(c)). The application of the precursor film can be performed by the spray method or slit coater method as mentioned above, or may be performed by a doctor blade method or bar-coater method. Steps to be performed later (steps shown in FIGS. 5(d) to 6(b)) are substantially the same as the above-mentioned steps (ii) to (v). That is, the insulating film 105 is subjected to exposure and development, so that the openings 107 for a via hole are formed in the insulating film 105 (see FIGS. 5(d) and 5(e)). Then, the insulating film. 105 is subjected to a heat treatment to convert into the inorganic metal oxide film, whereby the build-up insulating layer 106 made of the inorganic metal oxide film is produced (see FIG. 5(f)). Next, the build-up insulating layer 106 is plated to form the via holes 109 and the metal layer 108 (see FIG. 5(g)). The metal layer 108 is etched to form the build-up wiring patterns 110 (see FIG. 6(a)). Thereafter, these processes are repeatedly performed, so that alternating insulating films 105 and build-up wiring patterns 110 can be stacked over the release carrier 500 (see FIGS. 6(b) and 6(c)). Finally, as shown in FIGS. 6(c) and 6(d), the release carrier 500 can be removed to produce the excessively thin multilayer build-up substrate 100'.

Manufacturing Process of Third Embodiment

Next, another manufacturing method of a build-up substrate according to a manufacturing process of a third embodiment of the present invention will be described below with reference to FIGS. 7(a) to 7(h) (note that the same features as those in the "manufacturing process of the first embodiment" and the "manufacturing process of the second embodiment" will be omitted in principle to avoid the redundant description).

The manufacturing process of the third embodiment involves step (iv)' instead of the above step (iv). In the process of step (iv)', after forming a resist on the surface of the build-up insulating layer, the build-up insulating layer and the resist are subjected to plating as a whole. Finally, the resist is removed, which produces via holes and build-up wiring patterns in parts without resist.

Figure 7:
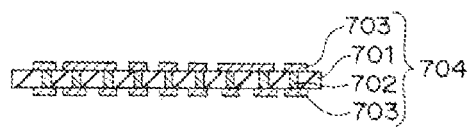
FIGS. 7(a) to 7(h) are cross-sectional views schematically showing the steps of the manufacturing process according to a third embodiment of the present invention.
Figure 7:
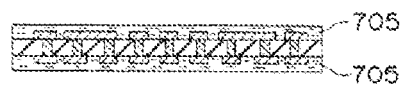
Figure 7:
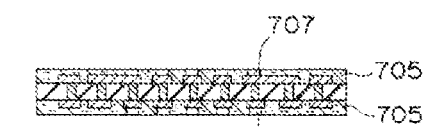
Figure 7:
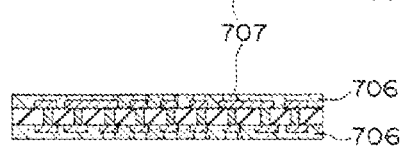
Figure 7:
Figure 7:
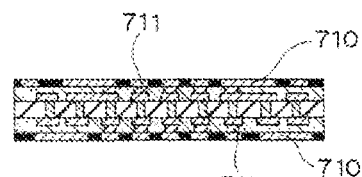
Figure 7:
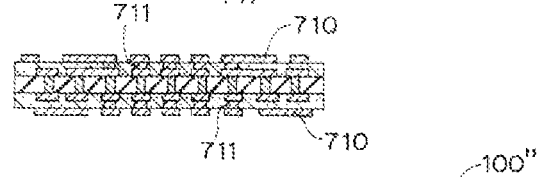
Figure 7:
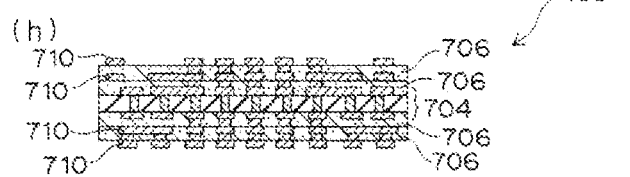

First, as shown in FIGS. 7(a) to 7(c), the above steps (i) to (iii) are performed. That is, a photosensitive metal oxide precursor material is applied to one or both sides of a circuit substrate 704 including wiring patterns 703, and then the applied material is dried to form an insulating film 705 (see FIGS. 7(a) and 7(b)). Then, the insulating film 705 is subjected to exposure and development, so that openings 707 for a via hole are formed in the insulating film 705 (see FIG. 7(c)). Next, the insulating film 705 is subjected to a heat treatment to convert into the inorganic metal oxide film, which produces the build-up insulating layer 706 made of the inorganic metal oxide film (see FIG. 7(d)).

A film electrode (not shown because of its small thickness) of about 10 to 100 nm in thickness may be formed such that the build-up layer with the openings 707 for the via hole is subjected to electrolytic plating of copper or the like in the following step. Such a film electrode can be formed, for example, by immersing the substrate in a Pd catalyst solution, drying the substrate, and then applying electroless nickel plating thereto entirely. Instead of the electroless plating to form the thin metal layer as a whole in this way, metal copper, metal nickel, an alloy of metal copper and metal titanium, or an alloy of metal nickel and metal chrome may be formed by sputtering. Over the thus-formed nickel metal layer or titanium layer, a photoresist 708 is formed at parts where the electrolytic copper plating is not to be applied by photolithography (see FIG. 7(e)). Specifically, after coating a resist over the entire substrate, a photoresist 708 can be formed by exposing the mask pattern with light and developing the resist. The thickness of the photoresist layer 708 is desirably equal to or more than 5 μm, which is the desired thickness of a copper electrode. Then, as shown in FIG. 7(f), the nickel layer previously formed is used as a common electrode, and a thicker copper layer 710 is formed by the electrolytic copper plating. The opening 707 is filled by the electrolytic copper plating to thereby form via holes 711. At this time, the opening may be subjected to a desmear treatment, a roughening treatment, and the like to improve the adhesion to the copper layer. After the electrolytic copper plating, as shown in FIG. 7(g), the resist 708 is removed, and then the entire surface is thinly etched to remove the copper surface and the nickel or titanium layer as the underlayer, thereby producing a finished piece. Thereafter, these processes are repeatedly performed, so that alternating build-up insulating films 706 and build-up wiring patterns 710 are stacked over the circuit substrate 704 (see FIG. 7(h)).

Manufacturing Processes of Other Embodiments

In the manufacturing method of the present invention, the temperature of the heat treatment (for example, calcination process) of the insulating film in step (iii) is desirably 250° C. or lower. This gives a wide choice of the circuit substrate having a wiring pattern. For example, a flexible substrate including a base which is not limited to a glass epoxy resin, but made of an organic film, such as PPS or PEN, can be used. The heat treatment (for example, calcination) of the insulating film in step (iii) is desirably performed under vacuum or inert gas atmosphere. This can prevent oxidation of the wiring pattern made of copper or the like.
(Photoactive Metal Oxide Precursor Material)

One of the features of the present invention, that is, the "photoactive metal oxide precursor material" will be described below in detail.

In the manufacturing method of the present invention, the photoactive metal oxide precursor material used in the step (i) may contain a photosensitive sol-gel material. Generally, starting from a metal oxide precursor solution, the sol-gel material is solidified into a gel (jelly solid) by a chemical reactions, including hydrolysis and condensation polymerization, through a heat treatment or the like, and then subjected to the further heat treatment to remove the solvent remaining inside the gel to promote the density thereof, which can produce an inorganic metal oxide, such as glass or ceramic. The "sol-gel method" using such a raw material can easily form a metal oxide film, such as a ceramic fired film or a glass film, at low temperature as compared to other methods. In the "sol-gel" method, the chemical reaction can be used at low temperature to manufacture the metal oxide film, which can make a hybrid between organic and inorganic materials. Specifically, the manufacturing method uses, for example, a solution of inorganic and/or organic metal salts as a starting solution. The solution is subjected to the hydrolysis and condensation polymerization to produce a colloidal solution (Sol), which is converted into a solid (Gel) losing fluidity by promoting its reaction. The Gel is subjected to the heat treatment, which can produce the metal oxide film.

Particularly, the photosensitive sol-gel material used in the manufacturing method of the present invention may contain an alkoxide compound. In such a case, the precursor solution containing the alkoxide compound is subjected to the hydrolysis and/or condensation polymerization, so that the build-up insulating layer made of the inorganic oxide film can be produced finally. An alkoxide as an alkoxide compound is a compound represented by $M(OR)_x$ (in which M is a material, and R is an alkyl group and/or an alkylene group). For example, $Si(OC_2H_5)_4$ (tetraethylsilane) as an alkoxide is used as a starting raw material, and an appropriate amount of water is added to the alkoxide material to cause the hydrolysis. Since the reaction with water is very slow, the hydrolysis may be promoted by use of acid and base catalysts in a short time. Thus, in the present invention, a photo-acid-generating agent may be added to the precursor raw material to control the reaction such that only a part of the raw material irradiated with the UV light promotes the reaction, and that the remaining part of the material delays the reaction.

Figure 2:
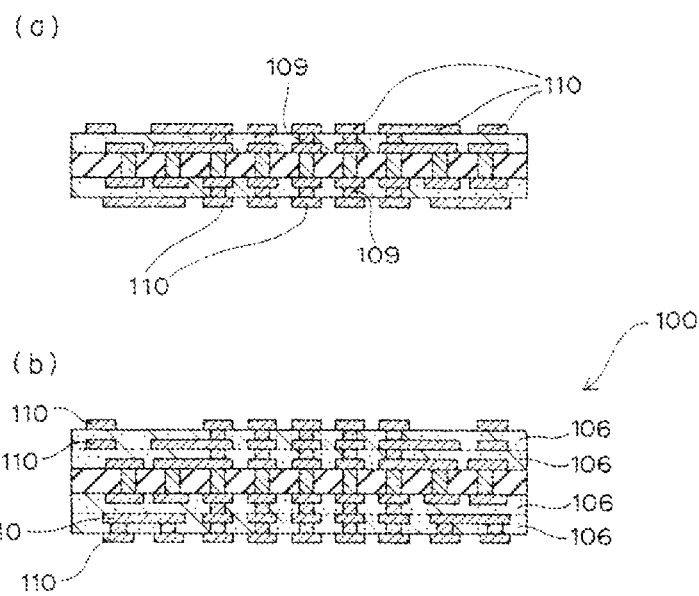
FIGS. 2(a) and 2(b) are cross-sectional views schematically showing other steps of the manufacturing process according to the first embodiment of the present invention.

The above-mentioned raw material can take the form of paste or liquid, and thus can be applied by the spray method or slit coater method (see FIG. 2 or 3). The precursor film (that is, insulating films 105, 705) made of the gel raw material is exposed to the UV light and etched by the solvent, and then further heated, which can produce a film of silicon oxide as a metal oxide. That is, the build-up insulating layers (106, 706) made of the silicon oxide film can be obtained.

In the present invention, the build-up insulating layer is not limited to a silicon oxide film, but can be formed of, for example, a film made of an oxide selected from the group consisting of aluminum oxide, magnesium oxide, and a compound thereof according to the kind of the used metal alkoxide. The oxide selected from the group consisting of aluminum oxide, silicon oxide, magnesium oxide, and a compound thereof is very desirable because of its excellent electrical insulation and heat conductivity (for example, as to the "heat conductivity", satisfactory heat conductivity of about 20 W/mK or less can be achieved).

In the present invention, the photosensitive sol-gel material may contain a hybrid material (composite material) containing an organic functionality in an inorganic network (inorganic network structure) on the molecular level. This structure can easily have the function of photosensitivity, and can also easily achieve the workability of via holes, while having the advantages of the adequate heat resistance as the inorganic material and bondability with the wiring pattern. The above hybrid material (composite material) may be, for example, a "siloxane oligomer having an organic functional group". Such hybrid material can control its composition on the molecular level, and can be easily applied to the electronics fields, including controlling its optical characteristics, insulation or dielectric constant by introducing various kinds of appropriate organic functional groups or the like. For example, the introduced organic functional group can provide various functions, including photosensitivity and transparency. For a "siloxane oligomer containing an organic functional group" by way of example, silsesquioxane may be used to introduce a maleimide group, a methacryloxy group and/or a phenyl group as an organic functional group. The introduction of the maleimide group can provide the "photosensitivity". The introduction of the methacryloxy group can provide the "low-temperature curability". The introduction of the phenyl group can improve the "film-forming ability or flexibility of the insulating film".

In the present invention, the photosensitive sol-gel raw material may contain "metal alkoxide chemically-modified with β-diketone or the like". For example, the photosensitive sol-gel raw material may contain metal alkoxide chemically-modified with acetylacetone or benzoylacetone. The use of such a photosensitive sol-gel raw material can form the inorganic metal oxide film containing $ZrO_2$, $TiO_2$, $Al_2O_3$, $Al_2O_3$—$SiO_3$, and the like. More specifically, β-diketone (for example, acetylacetone or benzoylacetone) as a chemical modifier, a sensitizer (for example, benzophenone or acetophenone), and a solvent (for example, an alcohol such as isopropyl alcohol) may be added to the appropriate metal alkoxide to prepare the raw material. The thus prepared raw material is applied to obtain the raw material film, to which the UV light can be irradiated to thereby form the above metal oxide film.

[Build-up Substrate and Semiconductor Integrated Circuit Package of the Invention]

The build-up substrate and semiconductor integrated circuit package of the present invention will be described below.

(Basic Structure of Build-Up Substrate)

Figure 8:
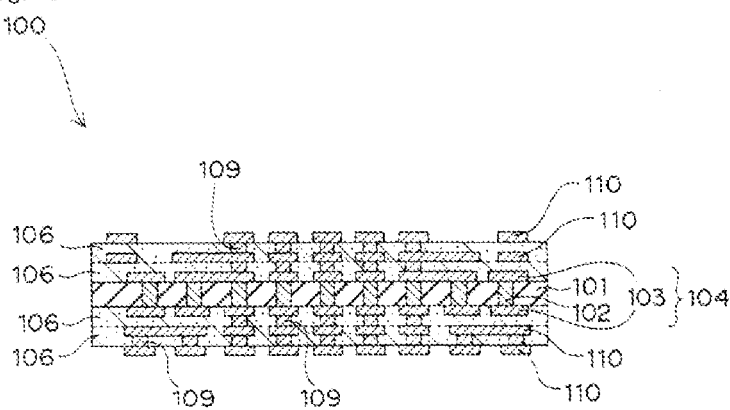
FIG. 8 is a cross-sectional view schematically showing the structure of a build-up substrate 100 in the present invention.

A build-up substrate 100 of the present invention is a substrate obtained by the above manufacturing method. As shown in FIG. 8, the build-up insulating layers 106 and the build-up wiring patterns 110 (electrode layers) are stacked over one or both sides of the circuit substrate 104 including the wiring patterns 103. Each build-up insulating layer 106 is made of the "inorganic metal oxide film formed of the photoactive metal oxide precursor material". The build-up layer 106 is not limited to a single layer, but may be formed of a plurality of layers (via holes 109 provided in the build-up layer being used to electrically connect the different wiring pattern layers together). As described above, in the build-up substrate 100 of the present invention, the "inorganic film of the metal oxide" of the build-up insulating film 106 contains, for example, at least one selected from the group consisting of aluminum oxide, silicon oxide, magnesium oxide, and a compound thereof. The thickness of the build-up insulating layer 106 is preferably 1 μm or more and 20 μm or less, more preferably 1 μm or more and 15 μm or less, and most preferably 1 μm or more and 10 μm or more (note that in some cases, the thickness of the build-up insulating layer can be less than 1 μm). Such a build-up insulating layer can suitably serve as a layer with excellent insulation and heat conductivity. The thin build-up insulating layer largely contributes to the thinning of electronic devices for use in mobile applications (by way of example, for the build-up insulating layer of 20 μm in thickness, even ten build-up insulating layers can be stacked to achieve a thin substrate having a thickness of about 0.2 mm).

When the "photoactive oxide precursor material" serving as a raw material for the build-up insulating layer contains oxide particles (powder of an oxide), the build-up insulating layer contains the oxide particles. In this case, for example, the build-up insulating layer contains $Al_2O_3$ particles, $SiO_2$ particles, MgO particles and/or $TiO_2$ particles (those particles having a particle diameter of about 0.1 μm to about 0.5 μm).

Figure 9:
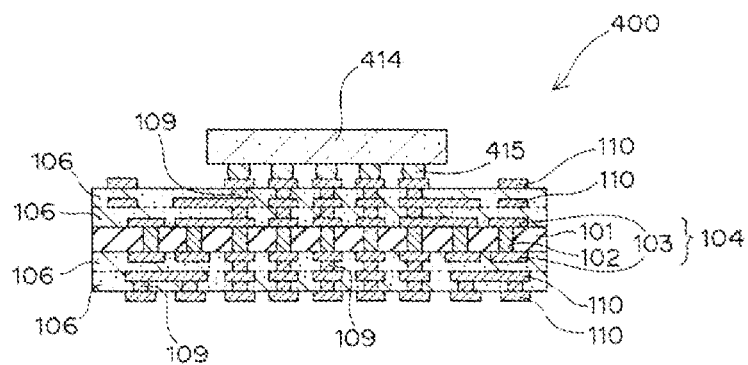
FIG. 9 is a cross-sectional view schematically showing the structure of a semiconductor integrated circuit package 400 in the present invention.

The build-up substrate 100 is cut into a desired size, and a semiconductor bare chip is mounted over the substrate, which can produce a semiconductor integrated circuit package 400 shown in FIG. 9.

The semiconductor integrated package 400 shown in FIG. 9 can be provided by mounting a semiconductor bare chip 414 over the build-up substrate 100 of the present invention by a controlled collapse chip connection (C4) mounting method. Such a semiconductor integrated circuit package 400 has the laminated structure with alternating inorganic metal oxide films and the copper wirings stacked on the build-up insulating layers. Thus, the semiconductor package 400 has a small change in warpage of the substrate for each of various types of heat histories, and the high reliability of the flip-chip mounting as the substrate has a thermal expansion coefficient similar to that of the semiconductor bare chip. The build-up substrate of the present invention has a better thermal conductivity than that of the normal build-up substrate, and can let heat escape quickly from the semiconductor bare chip. The semiconductor integrated circuit package 400 of the present invention can be thinned because of the thin build-up insulating layer as compared to the normal semiconductor integrated circuit package.

The "increase in size of the substrate" which is one of the features of the present invention will be described below. In the conventional art, the normal ceramic substrate made of inorganic material is comprised of just a sintered body having a size of about 100 mm square. However, in the present invention, in using the large-sized substrate having a size of 330 mm×500 mm, or 500 mm×500 mm, as the normal size of the substrate in the printed board industry, the build-up substrate can be easily obtained by coating the films and applying the heat treatment. Thus, the present invention has very excellent advantages from the viewpoint of industry because the infrastructure of the printed board industry, particularly, build-up makers can be used as they are.

The circuit substrate 104 having the wiring patterns may use the organic material as the insulating material, and may include at least one through hole penetrating the substrate. In this case, the above organic material is preferably any one of an epoxy resin, a phenol resin and a polyimide resin, or a combination thereof. This is because the circuit substrate made of an organic material which is inexpensive can be used.

Alternatively, the circuit substrate 104 having the wiring patterns may use the inorganic material as the insulating material, and may include at least one through hole penetrating the substrate. All materials included in the build-up substrate can be inorganic materials, which allows the build-up substrate to have excellent insulation and thermal conduction, and can provide the circuit substrate with high reliability from the viewpoint of the heat resistance and heat cycle. The above inorganic material may be preferably either glass or ceramic, or a combination thereof. Further, the above glass is preferably at least one glass selected from the group consisting of borosilicate glass, aluminosilicate glass and aluminoborosilicate glass. When the circuit substrate is made of a glass substrate in this way, all components of the build-up insulating layer and the wiring patterns are all made of inorganic material, which enhances the reliability of the substrate, and can have the high reliability of mounting because the thermal expansion coefficient of all the components is substantially similar to that of a silicon semiconductor. Recently, thin glass plates (of about 25 to 50 μm in thickness) have been increasingly supplied, which can produce build-up substrates that have adequate resistance to bending as a whole. The above ceramic is preferably at least one ceramic selected from the group consisting of alumina, mullite and zirconia. When the circuit substrate is the ceramic substrate, like the glass substrate, the circuit substrate has substantially the same thermal expansion coefficient as that of the silicon semiconductor, which can produce the build-up substrate with the high reliability. Further, this can also have the excellent effect of obtaining the build-up substrate with excellent thermal conductivity.

(Ultrathin Build-Up Substrate)

Figure 10:
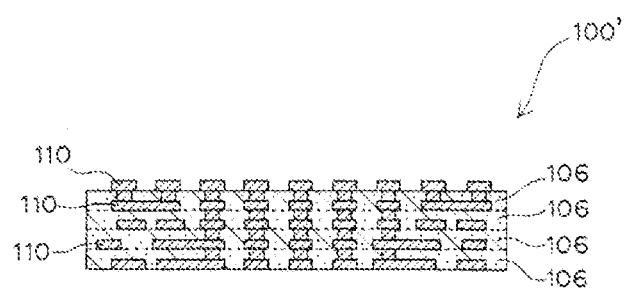
FIG. 10 is a cross-sectional view schematically showing the structure of a build-up substrate 100' in the present invention.

The invention can provide the ultrathin build-up substrate. This substrate is a multilayer build-up substrate 100' obtained according to the above-mentioned "manufacturing process of the second embodiment (see FIGS. 5 and 6)" (see FIG. 10).

Figure 11:
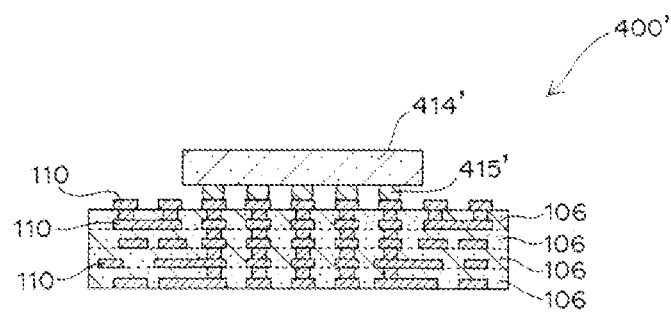
FIG. 11 is a cross-sectional view schematically showing the structure of a semiconductor integrated circuit package 400' in the present invention.

Such an ultrathin build-up substrate 100' is suitable for use in a semiconductor integrated circuit package 400', while having the high reliability (see FIG. 11). In forming the build-up substrate, the size of the release carrier is not limited, so that a large-sized substrate having a size of, for example, 330 mm×500 mm, or 500 mm×500 mm as a general size in the printed board industry, can be easily achieved.

(Build-Up Substrate with Transistor)

Since the build-up insulating film is obtained using the "photoactive metal oxide precursor material" and has such a high insulation that cannot be obtained from the organic insulating material, the build-up substrate of the present invention is formed to be excessively thin and can exhibit the higher functions. For example, as shown in FIG. 12, the build-up substrate including the transistors within the build-up substrate or at a superficial layer thereof can be achieved.

Figure 12:
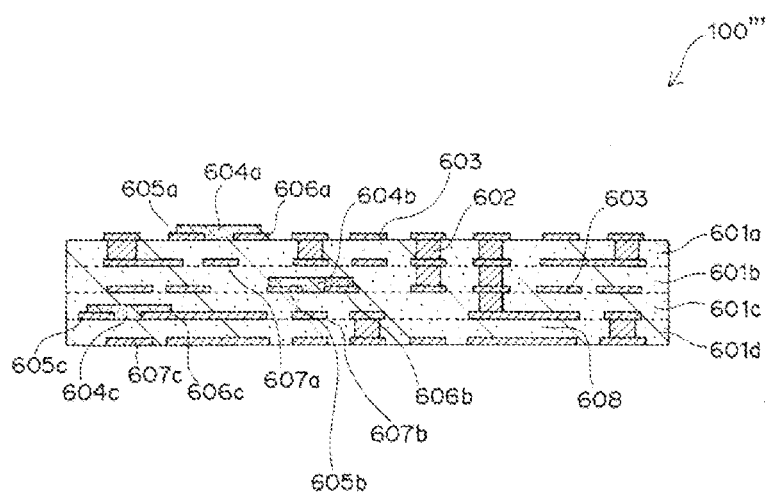
FIG. 12 is a cross-sectional view schematically showing the structure of a build-up substrate 100''' including a transistor in the present invention.

In the structure shown in FIG. 12, wiring patterns 605a, 605b and 605c, and wiring patterns 606a, 606b, and 606c are formed over build-up insulating layers 601a, 601b, 601c and 601d, and metal oxide semiconductor films 604a, 604b and 604c are respectively formed in contact with these wiring patterns, thereby providing field effect transistors. In the build-up substrate having the structure shown in FIG. 12, the wiring patterns 605a, 605b and 605c and the wiring patterns 606a, 606b and 606c can serve as the source or drain, the metal oxide semiconductor films 604a, 604b and 604c can serve as the semiconductor layer, and the inorganic films 601a, 601b and 601c of the metal oxide can serve as the gate insulating film. The wiring pattern directly above or under the gate insulating film can serve as the gate electrode. An In—Ga—Zn—O based or In—Zn—O based metal oxide semiconductor can be used as the metal oxide semiconductors 604a, 604b and 604c. Although the metal oxide semiconductor can be manufactured by the sputtering, the build-up insulating layer of the present invention can also be formed by applying the metal oxide precursor material.

In the present invention of the present application, the build-up insulating layer is formed of, for example, a thin inorganic metal oxide film of about 1 μm in thickness, so that the build-up insulating layer on the metal oxide semiconductor film formed on the wiring layers acting as the source electrode and the drain electrode serves as the gate insulating film, and the wiring patterns formed on the build-up insulating layer serve as the gate electrode. With this arrangement, when applying a potential to the gate electrode with applying the voltage between the source electrode and drain electrode, the metal oxide semiconductor film can serve as a switch to control the drain current. In this way, the semiconductor element can be formed within the build-up substrate or its superficial layer, which can achieve the build-up substrate incorporating therein an active element.

Obviously, the present invention can use the thin build-up insulating film to provide a capacitor. Specifically, a desired wiring pattern is further formed on the thin insulating layer to thereby form the capacitor. In the present invention, the insulating layer is so thin and has excellent insulation, and can increase a dielectric constant as compared to the organic material, thereby enabling to provide the high-capacity capacitor within the build-up substrate or its superficial layer. As a result, not only the active element, but also a passive element, such as a capacitor or a resistor, can be incorporated therein to exhibit its function. Further, the multilayer build-up substrate 100' obtained in the above-mentioned "manufacturing process of the second embodiment (see FIGS. 5 and 6)", that is, the substrate including the build-up layers and the wiring patterns without having the circuit substrate can include the field-effect transistor described above. It is noted that the metal oxide semiconductor can be normally obtained by applying and heating the metal oxide semiconductor precursor material, like the present invention, but requires the heating at a temperature of about 550° C. Conventionally, there is not a build-up substrate that can withstand such a high temperature. In contrast, in the present invention, the inorganic build-up substrate formed of the metal wiring layer and the build-up insulating film made of the inorganic metal oxide can avoid the inconveniences described above. When mounting the semiconductor bare chip on the build-up substrate, the present invention can achieve the semiconductor integrated circuit package with an excessively higher function, in which the field-effect transistor incorporated serves as a protective element, and which includes the capacitor suppressing variations in power supply voltage.

Finally for confirmation purpose it is noted that the present invention includes following aspects.

Aspect 1: A method for manufacturing a build-up substrate, the build-up substrate including an insulating layer and a wiring pattern layer stacked over a circuit substrate, the method includes the steps of:

(i) applying a photoactive metal oxide precursor material to one or both sides of the circuit substrate with a wiring pattern, and drying the applied photoactive metal oxide precursor material to form an insulating film;

(ii) forming an opening for a via hole in the insulating film by exposure and development of the insulating film;

(iii) applying a heat treatment to the insulating film to convert the insulating film into a metal oxide film, thereby forming a build-up insulating layer of the metal oxide film; and (iv) plating the build-up insulating layer to form via holes in the openings, forming a metal layer on the build-up insulating layer, and etching the metal layer to form a build-up wiring pattern; and (v) repeating the steps from (i) to (iv) at least one time.

Aspect 2: The method for manufacturing a build-up substrate according to aspect 1, wherein the heat treatment of the insulating film in the step (iii) is performed at a temperature of 500° C. or lower and 100° C. or higher. For example, the heat treatment of the insulating film is, preferably, at 400° C. or lower, and more preferably at 300° C. or lower, for example, may be at 250° C. or lower. By way of example, the insulation layer may be converted into the metal oxide film by performing calcination, thereby obtaining the build-up insulating layer.

Aspect 3: The method for manufacturing a build-up substrate according to aspect 1 or 2, wherein the heat treatment of the insulating film in the step (iii) is performed under vacuum or inert gas atmosphere.

Aspect 4: The method for manufacturing a build-up substrate according to any one of aspects 1 to 3, wherein the photoactive metal oxide precursor material used in the step (i) contains a photosensitive sol-gel material.

Aspect 5: The method for manufacturing a build-up substrate according to aspect 4, wherein the photoactive metal oxide precursor material used in the step (i) contains an alkoxide compound.

Aspect 6: The method for manufacturing a build-up substrate according to aspect 5, wherein in the step (iii), the metal oxide film is formed from the alkoxide compound through hydrolysis of the alkoxide compound.

Aspect 7: The method for manufacturing a build-up substrate according to any one of aspects 1 to 6, wherein the photoactive metal oxide precursor material used in the step (i) contains a hybrid material containing an organic functional group in an inorganic network.

Aspect 8: The method for manufacturing a build-up substrate according to aspect 7, wherein the hybrid material is siloxane oligomer containing an organic functional group.

Aspect 9: The method for manufacturing a build-up substrate according to any one of aspects 1 to 8, wherein in the step (i), the photoactive metal oxide precursor material is applied by a spray method or slit coater method. This means that the "photoactive metal oxide precursor material" can take the form of paste or liquid, and thus can be applied by the spray method or slit coater method.

Aspect 10: The method for manufacturing a build-up substrate according to any one of aspects 1 to 9, wherein the circuit substrate comprises a metal foil or an organic film with the wiring pattern, wherein in the step (i), the photoactive metal oxide precursor material is applied to one side of the circuit substrate, and wherein after the step (v), the metal foil or organic film is removed. In the manufacturing method of aspect 10, a built-up substrate without a core substrate can be obtained. Thus, an ultrathin multi-layer build-up substrate can be obtained.

Aspect 11: The method for manufacturing a build-up substrate according to any one of aspects 1 to 10, comprising the step (iv)' of: instead of the step (iv), after forming a resist over a surface of the build-up insulating layer, entirely plating the build-up insulating layer and the resist, and finally removing the resist, so that the via hole and the build-up wiring pattern are provided in parts without the resist. That is, in the manufacturing method of the present invention, the via hole and the build-up wiring pattern may be formed using the resist.

Aspect 12: The method for manufacturing a build-up substrate according to any one of aspects 1 to 11, wherein the photoactive oxide precursor material contain a particle made of material selected from the group consisting of $Al_2O_3$, $SiO_2$, MgO and $TiO_2$ (particle size: 0.1 μm to 0.5 μm).

Aspect 13: A build-up substrate comprising a build-up insulating layer and a build-up wiring pattern stacked over one or both sides of a circuit substrate with a wiring pattern, wherein the build-up insulating layer is made of a metal oxide film formed from a photoactive metal oxide precursor material.

Aspect 14: The build-up substrate according to aspect 12, wherein the metal oxide film of the build-up insulating layer contains at least one metal oxide selected from the group consisting of aluminum oxide, silicon oxide and magnesium oxide.

Aspect 15: The build-up substrate according to aspect 13 of 14, wherein the build-up insulating layer has a thickness of 1 μm or more and 20 μm or less. That is, the built-up insulating layer of the invention can achieved to be an ultrathin insulating layer, for examples, having a thickness of 1 μm or more and 20 μm or less.

Aspect 16: The build-up substrate according to any one of aspects 13 to 15, wherein an insulating base (insulating part) of the circuit substrate is formed of organic material, and wherein at least one through hole penetrating the insulating base (insulating part) is provided in the circuit substrate.

Aspect 17: The build-up substrate according to aspect 16, wherein the organic material of the insulating base contains at least one selected from the group consisting of an epoxy resin, a phenol resin and a polyimide resin.

Aspect 18: The build-up substrate according to any one of aspects 13 to 15, wherein an insulating base (insulating part) of the circuit substrate is formed of inorganic material, and wherein at least one through hole penetrating the insulating base (insulating part) is provided in the circuit substrate.

Aspect 19: The build-up substrate according to aspect 18, wherein the inorganic material of the insulating base contains at least one selected from the group consisting of a glass component and a ceramic component.

Aspect 20: The build-up substrate according to aspect 19, wherein the glass component is at least one kind of the glass component selected from the group consisting of borosilicate glass, aluminosilicate glass and aluminoborosilicate glass.

Aspect 21: The build-up substrate according to aspect 19, wherein the ceramic component is at least one ceramic component selected from the group consisting of alumina, mullite and zirconia.

Aspect 22: The build-up substrate according to any one of aspects 13 to 21, wherein a transistor element is provided in the build-up substrate, wherein at least a part of the metal oxide film of the build-up insulating layer serves as a gate insulating film, wherein the build-up substrate comprises:

a semiconductor film formed of an a oxide semiconductor over the metal oxide film;

source and drain electrodes each formed of at least a part of the build-up wiring pattern and in contact with the semiconductor film; and a gate electrode formed of at least a part of the build-up wiring pattern positioned on "a side opposite to a surface of the gate insulating film with the semiconductor film formed thereat".

Aspect 23: The build-up substrate according to any one of aspects 13 to 22, wherein the metal oxide film of the build-up insulating layer contains a particle made of material selected from the group consisting of $Al_2O_3$, $SiO_2$, MgO and $TiO_2$ (particle size: 0.1 μm to 0.5 μm).

Aspect 24: A semiconductor integrated circuit package, comprising the build-up substrate according to any one of aspects 13 to 23, wherein a semiconductor bare chip is flip-chip mounted on the build-up wiring pattern on the build-up insulating layer via a bump.

Although the present invention has been described above, the preferred embodiments of the present invention are illustrative only, and thus are merely typical examples within the scope of the present invention. Therefore, the present invention is not limited to those disclosed embodiments. It is easily understood by those skilled in the art that various embodiments can be additionally or alternatively provided.

Finally, the following will refer to the effects exhibited by the present invention.

In the manufacturing method of the build-up substrate in the present invention, the insulating film is formed using the photosensitive metal oxide precursor solution over one or both sides of the circuit substrate as a core. After forming the openings for via holes, the substrate is subjected to the heat treatment, such as calcination, to form the metal oxide insulating film. Thus, the manufacturing method of the present invention can produce the thin build-up insulating film having excellent reliability of insulation.

The photosensitive metal oxide precursor solution is applied and dried, and then collectively exposed with light using a mask and developed to produce the openings for the via holes. This results in satisfactory positional accuracy of the via holes, and can easily form the via holes having a small diameter of about 5 to 20 μm in the large-sized substrate at low cost. The dense metal oxide insulating film is obtained as the build-up insulating film, which does not leave the residues, including organic materials, and thus eliminates the necessity of the desmear process of the build-up substrate. Furthermore, since the application of the metal oxide precursor solution can be performed by the spray method or slit coater method, the uniform film can be formed easily in a large size.

The manufacturing method of the present invention in the present application can perform calcination of the metal oxide precursor film at a low temperature, preferably, 250° C. or lower. Thus, any circuit substrate for various types of cores can be arbitrarily selected. The basic structure of the present invention includes a lamination of the insulating material layers and the wiring pattern layers. The insulating material layer is formed of the inorganic build-up insulating material obtained by calcining the photosensitive inorganic metal oxide precursor film. The thus-obtained insulating layer is dense, and has excellent insulation and reliability of insulation. In this way, the build-up substrate of the present invention includes the insulating film that can be applied to thin fine wiring patterns and which has high elastic modulus and reliability.

The inorganic build-up insulating layer can be formed of aluminum oxide, silicon oxide, magnesium oxide, and the like by the heat treatment, including calcination. Thus, the insulating layer has the excellent reliability of insulation, and also the high thermal conductivity, and is desirable as the build-up substrate for a high integrated semiconductor package. For example, the build-up insulating layer is formed of inorganic/organic hybrid material containing an organic functional group in an inorganic network on the molecular level. Thus, the build-up insulating layer can easily exhibit the functions, including photosensitivity, and can have the excellent workability of the via holes, while advantageously maintaining the heat resistance and the bondability to the wiring pattern as the inorganic material. Since the build-up insulating film is the metal oxide film, the thin layer with a high elastic modulus but having a small thickness of, for example, 1 μm or more and 20 μm or less can be provided which has the dense insulating film. As a result, the thin semiconductor package suitable for mobile applications or the like can be achieved.

In the substrate structure of the present invention, the organic material can be used as the insulating material for the circuit substrate having the wiring patterns, which can exhibit some bending property. Thus, the present invention can achieve the build-up substrate having the high reliability of insulation and flexibility. When the circuit substrate with the wiring pattern is made of a glass substrate of the inorganic material, all components of the build-up insulating layer and the wiring patterns are made of inorganic material, which enhances the reliability of the substrate, and can have the high reliability of mounting because the thermal expansion coefficient of all the components is substantially similar to that of a silicon semiconductor. When the insulating material of the circuit substrate is the ceramic substrate, like the glass substrate, the circuit substrate has substantially the same thermal expansion coefficient as that of the silicon semiconductor, which can produce the build-up substrate with the high reliability and excellent thermal conductivity.

The invention can achieve the build-up substrate including the transistor element formed by appropriately using the insulating material layer made of the inorganic metal oxide film. In this way, the present invention can provide the multifunctional build-up substrate including an active element.

The invention can also provide the semiconductor integrated circuit package including the semiconductor bare chip flip-chip mounted over the build-up substrate via bumps. However, the present invention can also achieve the high integrated semiconductor package which has the excellent thermal resistance and thermal conductivity because the substrate part is composed of the wiring patterns and the inorganic metal oxide films, and which has the high reliability of mounting because the substrate has substantially the same thermal expansion as that of the semiconductor chip.

The build-up substrate of the present invention has the high elasticity and appropriate thermal expansion even when the substrate is thin in thickness and large in size, which can suppress the break or cracking of the build-up substrate. Thus, the build-up substrate of the present invention can suppress the break, cracking or warpage even when the substrate is thin and large. According to the present invention, the conventional manufacturing infrastructure of the printed board can be used to suitably manufacture the build-up substrate.

Further, the build-up substrate of the present invention uses the insulating material of the metal oxide, which enables selection of one from various dielectric constants (by way of example, $\in$=about 2.5). In selecting the low-dielectric constant material, the build-up substrate can be excellent in high frequency characteristics.

As mentioned above, the present invention has the special effects that cannot be obtained by the conventional build-up substrate. That is, the inorganic build-up insulating film of the present invention has the excellent reliability of insulation of the insulating material even in forming fine wirings or thinning the film. The inorganic build-up insulating film is so photosensitive as to form the via holes by collectively performing the development and heating treatments, which eliminates the expensive devices, including a laser processor, and can achieve not only the high accuracy of the processes position, but also the appropriate decrease in diameter of the via hole (by way of example, 20 μm or less in diameter size).

INDUSTRIAL APPLICABILITY

The build-up substrate according to the present invention is suitably used as a substrate for a thin mobile device, or a substrate for a high-brightness LED that requires the adequate heat dissipation, and also suitably used as a substrate for an electronic device with electronic parts mounted in high density.

Particularly, the build-up substrate according to the present invention is appropriate for devices that require thinning and high reliability, and is used as the build-up substrate for the semiconductor package that has the high heat dissipation, stability in size, and reliability. Thus, the build-up substrate of the present invention is also useful as a substrate for a semiconductor package mounting a CPU semiconductor integrated circuit, such as a computer or a server.

CROSS REFERENCE TO RELATED PATENT APPLICATION

This application claims priority under the Paris Convention on Japanese Patent Application No. 2012-71996 filed on Mar. 27, 2012, titled "BUILD-UP SUBSTRATE, MANUFACTURING METHOD THEREOF, AND SEMICONDUCTOR INTEGRATE CIRCUIT PACKAGE", the content of which is incorporated by reference herein.

EXPLANATION OF REFERENCE NUMERALS 100, 100', 100", 1000''' Build-up substrate
101 Insulating base
102 Via hole/Via/Through hole
103 Wiring pattern
104 Circuit substrate
105 Insulating film (Metal oxide precursor film)
106 Build-up insulating film (inorganic film of metal oxide)
107 Opening for a via hole
108 Metal layer
109 Plating filled via hole/via
110 Build-up wiring pattern
201 Stage
202 Substrate
203 Spray nozzle
204 reservoir tank
205 metal oxide precursor material
206 Supply pipe
207 Press pump
208 Pipe
209 Spray mist
210 Coated film formed by a spray method
301 Stage
302 Substrate
303 Slit coater nozzle
304 Manifold
305 Slit
306 Reservoir tank
307 Pipe
308 Pump
310 Coated film formed by a slit coater method
400, 400' Semiconductor integrated circuit package (high integrated semiconductor package)
414, 414' Semiconductor chip
415, 415' Solder bump
500 Release carrier
501 Wiring pattern
601a to 601d Build-up insulating layer (Inorganic metal oxide film)
602 Via hole/Via
603 Wiring pattern
604a to 604c Metal oxide semiconductor
605a to 605c Drain electrode
606a to 606c Source electrode
607a to 607c Gate electrode
608 Capacitor layer
701 Insulating base
702 Via hole
703 Wiring pattern
704 Circuit substrate
705 Insulating film (Metal oxide precursor film)
706 Build-up insulating film (Inorganic metal oxide film)
707 Opening for a via hole
708 Resist
710 Metal layer/Build-up wiring pattern
711 Plating filled via hole/via

The invention claimed is:

1. A method for manufacturing a build-up substrate, the build-up substrate comprising an insulating layer and a wiring pattern layer stacked over a circuit substrate, said method comprising the steps of:
   (i) applying a photoactive oxide precursor material to one or both sides of the circuit substrate with a wiring pattern, and drying the applied photoactive oxide precursor material to form an insulating film;
   (ii) forming an opening for a via hole in the insulating film by exposure and development of the insulating film;
   (iii) applying a heat treatment to the insulating film to convert the insulating film into an oxide film, thereby forming a build-up insulating layer of the oxide film; and
   (iv) plating the build-up insulating layer to form a via hole in the opening, forming a metal layer on the build-up insulating layer, and etching the metal layer to form a build-up wiring pattern; and
   (v) repeating the steps from (i) to (iv) at least one time, wherein
   the photoactive oxide precursor material is a hybrid material containing an organic functionality in an inorganic network thereof, and
   the hybrid material is a siloxane oligomer with a maleimide group therein.

2. The method for manufacturing a build-up substrate according to claim 1, wherein the heat treatment of the insulating film in the step (iii) is performed at a temperature of 500° C. or lower and 100° C. or higher.

3. The method for manufacturing a build-up substrate according to claim 1, wherein the heat treatment of the insulating film in the step (iii) is performed under vacuum or inert gas atmosphere.

4. The method for manufacturing a build-up substrate according to claim 1, wherein the photoactive oxide precursor material used in the step (i) contains a photosensitive sol-gel material.

5. The method for manufacturing a build-up substrate according to claim 4, wherein the photoactive oxide precursor material used in the step (i) contains an alkoxide compound.

6. The method for manufacturing a build-up substrate according to claim 5, wherein in the step (iii), the oxide film is formed from the alkoxide compound through hydrolysis of the alkoxide compound.

7. The method for manufacturing a build-up substrate according to claim 1, wherein in the step (i), the photoactive oxide precursor material is applied by a spray method or slit coater method.

8. The method for manufacturing a build-up substrate according to claim 1, wherein the circuit substrate comprises a metal foil or an organic film with the wiring pattern,
   wherein in the step (i), the photoactive oxide precursor material is applied to one side of the circuit substrate, and
   wherein after the step (v), the metal foil or organic film is removed.

9. A method for manufacturing a build-up substrate, the build-up substrate comprising an insulating layer and a wiring pattern layer stacked over a circuit substrate, said method comprising the steps of:
   (i) applying a photoactive oxide precursor material to one or both sides of the circuit substrate with a wiring pattern, and drying the applied photoactive oxide precursor material to form an insulating film;
   (ii) forming an opening for a via hole in the insulating film by exposure and development of the insulating film;
   (iii) applying a heat treatment to the insulating film to convert the insulating film into an oxide film, thereby forming a build-up insulating layer of the oxide film; and
   (iv) after forming a resist over a surface of the build-up insulating layer, entirely plating the build-up insulating layer and the resist, and finally removing the resist, so that the via hole and a build-up wiring pattern are provided in parts without the resist; and (v) repeating the steps from (i) to (iv) at least one time, wherein
the photoactive oxide precursor material is a hybrid material containing an organic functionality in an inorganic network thereof, and
the hybrid material is a siloxane oligomer with a maleimide group therein.

10. A build-up substrate comprising a build-up insulating layer and a build-up wiring pattern stacked over one or both sides of a circuit substrate with a wiring pattern, wherein the build-up insulating layer is made of an oxide film formed from a photoactive metal oxide precursor material, wherein
the photoactive oxide precursor material is a hybrid material containing an organic functionality in an inorganic network thereof, and
the hybrid material is a siloxane oligomer with a maleimide group therein.

11. The build-up substrate according to claim 10, wherein the oxide film of the build-up insulating layer contains at least one oxide selected from the group consisting of aluminum oxide, silicon oxide and magnesium oxide.

12. The build-up substrate according to claim 10, wherein the build-up insulating layer has a thickness of 1 μm or more and 20 μm or less.

13. The build-up substrate according to claim 10, wherein an insulating base of the circuit substrate is formed of organic material, and wherein at least one through hole penetrating the insulating base is provided in the circuit substrate.

14. The build-up substrate according to claim 13, wherein the organic material of the insulating base contains at least one selected from the group consisting of an epoxy resin, a phenol resin and a polyimide resin.

15. The build-up substrate according to claim 10, wherein an insulating base of the circuit substrate is formed of inorganic material, and wherein at least one through hole penetrating the insulating base is provided in the circuit substrate.

16. The build-up substrate according to claim 15, wherein the inorganic material of the insulating base contains at least one selected from the group consisting of a glass component and a ceramic component.

17. The build-up substrate according to claim 16, wherein the glass component is at least one kind of the glass component selected from the group consisting of borosilicate glass, aluminosilicate glass and aluminoborosilicate glass.

18. The build-up substrate according to claim 16, wherein the ceramic component is at least one ceramic component selected from the group consisting of alumina, mullite and zirconia.

19. The build-up substrate according to claim 10, wherein a transistor element is provided in the build-up substrate,
wherein at least a part of the oxide film of the build-up insulating layer serves as a gate insulating film,
wherein the build-up substrate comprises:
a semiconductor film formed of an oxide semiconductor over the oxide film;
source and drain electrodes each formed of at least a part of the build-up wiring pattern and in contact with the semiconductor film; and
a gate electrode formed of at least a part of the build-up wiring pattern positioned on a side opposite to a surface of the gate insulating film with the semiconductor film formed thereat.

20. A semiconductor integrated circuit package, comprising the build-up substrate according to claim 10, wherein a semiconductor bare chip is flip-chip mounted on the build-up wiring pattern on the build-up insulating layer via a bump.

* * * * *